(12) United States Patent
Shinyama et al.

(10) Patent No.: US 7,030,496 B2
(45) Date of Patent: Apr. 18, 2006

(54) SEMICONDUCTOR DEVICE HAVING ALUMINUM AND METAL ELECTRODES AND METHOD FOR MANUFACTURING THE SAME

(75) Inventors: Keiji Shinyama, Okazaki (JP); Shoji Miura, Nukata-gun (JP); Ichiharu Kondo, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/878,435

(22) Filed: Jun. 29, 2004

(65) Prior Publication Data

US 2005/0006778 A1 Jan. 13, 2005

(30) Foreign Application Priority Data

Jul. 11, 2003 (JP) ............................. 2003-273456

(51) Int. Cl.
*H01L 23/48* (2006.01)
*H01L 23/52* (2006.01)
*H01L 29/40* (2006.01)

(52) U.S. Cl. ...................... 257/773; 257/712; 257/713; 257/737; 257/786; 257/690

(58) Field of Classification Search ................ 257/786, 257/773, 712, 713, 690, 737

See application file for complete search history.

(56) References Cited

U.S. PATENT DOCUMENTS

| | | | | |
|---|---|---|---|---|
| 4,470,063 A | * | 9/1984 | Arakawa et al. | ............. 257/746 |
| 5,287,003 A | * | 2/1994 | Van Andel et al. | ......... 257/792 |
| 5,289,036 A | * | 2/1994 | Nishimoto | ................... 257/774 |
| 5,290,732 A | * | 3/1994 | Kumar et al. | ................. 216/13 |
| 6,693,350 B1 | | 2/2004 | Teshima et al. | |
| 2003/0022464 A1 | | 1/2003 | Hirano et al. | |
| 2004/0066630 A1 | * | 4/2004 | Whittenburg et al. | ........ 361/719 |

FOREIGN PATENT DOCUMENTS

| | | |
|---|---|---|
| JP | A-56-153322 | 11/1981 |
| JP | A-57-39548 | 3/1982 |
| JP | A-63-305532 | 12/1988 |

* cited by examiner

*Primary Examiner*—Nitin Parekh
(74) *Attorney, Agent, or Firm*—Posz Law Group, PLC (57) ABSTRACT

A semiconductor device includes a semiconductor substrate; an aluminum electrode disposed on the substrate; a protection film disposed on the aluminum electrode; an opening disposed on the protection film for exposing the aluminum electrode; and a metal electrode disposed on a surface of the aluminum electrode through the opening. The aluminum electrode includes a concavity disposed under the opening. The aluminum electrode disposed at the concavity has a thickness equal to or larger than a depth of the concavity. The surface of the aluminum electrode includes multiple concavities and multiple convexities.

16 Claims, 6 Drawing Sheets

SEMICONDUCTOR DEVICE HAVING ALUMINUM AND METAL ELECTRODES AND METHOD FOR MANUFACTURING THE SAME

CROSS REFERENCE TO RELATED APPLICATION

This application is based on Japanese Patent Application No. 2003-273456 filed on Jul. 11, 2003, the disclosure of which is incorporated herein by reference.

FIELD OF THE INVENTION

The present invention relates to a semiconductor device having an aluminum electrode and a metallic electrode disposed thereon. Further, the present invention relates to a method for manufacturing a semiconductor device having an aluminum electrode and a metallic electrode disposed thereon.

BACKGROUND OF THE INVENTION

A semiconductor device includes a semiconductor substrate with an aluminum electrode thereon and a heat sink soldered on the aluminum electrode through a metallic electrode. This semiconductor device is disclosed in Japanese Patent Application Publications No. 2002-110893 and No. 2003-110064. In this device, a protection film is formed on the aluminum electrode disposed on one surface of the semiconductor substrate. Then, an opening is formed in the protection film so that the surface of the aluminum electrode is exposed from the opening. Next, a metallic electrode for soldering is formed on the surface of the aluminum electrode through the opening by a plating method or the like. In these processes, a bump electrode technique is used. The bump electrode technique is disclosed in Japanese Patent Application Publication No. S63-305532.

In general, adhesion between the aluminum electrode and the metallic electrode is comparatively weak. Therefore, the metallic electrode may be removed from the aluminum electrode.

SUMMARY OF THE INVENTION

In view of the above-described problem, it is an object of the present invention to provide a semiconductor device having an aluminum electrode and a metallic electrode disposed thereon. The adhesion between the aluminum electrode and the metallic electrode is comparatively strong. Further, it is another object of the present invention to provide a method for manufacturing a semiconductor device having an aluminum electrode and a metallic electrode disposed thereon.

A semiconductor device includes a semiconductor substrate; an aluminum electrode disposed on the substrate; a protection film disposed on the aluminum electrode; an opening disposed on the protection film for exposing the aluminum electrode; and a metal electrode disposed on a surface of the aluminum electrode through the opening. The aluminum electrode includes a concavity disposed under the opening. The aluminum electrode disposed at the concavity has a thickness equal to or larger than a depth of the concavity. The surface of the aluminum electrode includes multiple concavities and multiple convexities.

In the above device, the metal electrode is formed on the surface of the aluminum electrode having the concavities and convexities so that the bonding area between the aluminum electrode and the metal electrode becomes large. Thus, anchor effect for bonding the metal electrode to the aluminum electrode becomes larger so that the adhesion between the aluminum electrode and the metal electrode is improved by the anchor effect. The adhesion between the aluminum electrode and the metallic electrode is comparatively strong.

Preferably, the opening of the protection film is smaller than the concavity so that the protection film overhangs the concavity of the aluminum electrode. More preferably, the metal electrode is disposed in the concavity of the aluminum electrode and the opening. Furthermore preferably, the metal electrode is thinner than the protection film so that an upper surface of the metal electrode is disposed in a middle of the opening.

Preferably, the aluminum electrode includes an additive having an etch rate equal to or smaller than that of aluminum in the aluminum electrode so that the convexities are provided on the surface of the aluminum electrode. More preferably, the additive is disposed on the surface of the aluminum electrode so that the convexities are provided.

Preferably, the metal electrode connects to an external circuit through a lead free solder. More preferably, the opening of the protection film has a tapered shape with a tapered angle, which is smaller than a supplementary angle of a solder contact angle of the lead free solder. The metal electrode is disposed in the concavity of the aluminum electrode and the opening. The metal electrode is thinner than the protection film so that an upper surface of the metal electrode is disposed in a middle of the opening.

Further, a method for manufacturing a semiconductor device includes the steps of: forming an aluminum electrode on a semiconductor substrate, wherein the aluminum electrode includes an additive having an etch rate equal to or smaller than that of aluminum in the aluminum electrode; forming a protection film on the aluminum electrode; forming an opening on the protection film for exposing the aluminum electrode; etching the aluminum electrode through the opening so that multiple concavities and multiple convexities are formed on the surface of the aluminum electrode; and forming a metal electrode on the surface of the aluminum electrode through the opening.

The above method provides the semiconductor device having a strong adhesion between the aluminum electrode and the metallic electrode.

Furthermore, a method for manufacturing a semiconductor device includes the steps of: forming an aluminum electrode on a semiconductor substrate; forming a protection film on the aluminum electrode; forming an opening on the protection film for exposing the aluminum electrode; forming a small etch rate part on the aluminum electrode disposed at the opening, wherein the small etch rate part has an etch rate equal to or smaller than that of aluminum in the aluminum electrode; etching the aluminum electrode with the small etch rate part through the opening so that multiple concavities and multiple convexities are formed on the surface of the aluminum electrode; and forming a metal electrode on the surface of the aluminum electrode through the opening.

The above method provides the semiconductor device having a strong adhesion between the aluminum electrode and the metallic electrode.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

Figure 8:
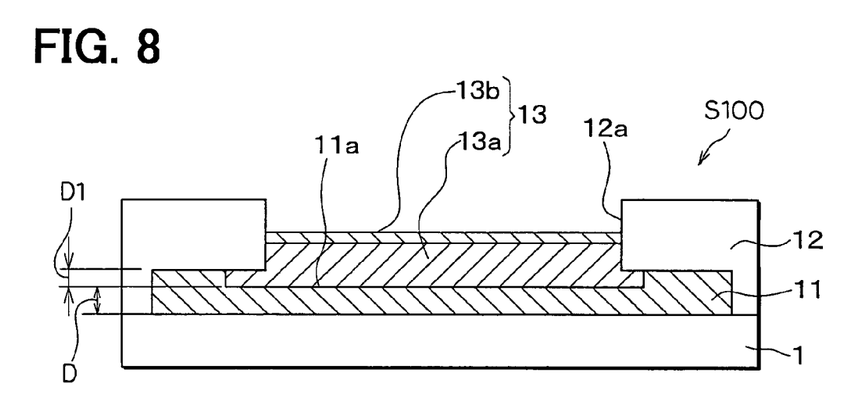
FIG. 8 is a partially enlarged cross sectional view showing an emitter electrode of a semiconductor device as a comparison according to the first embodiment.
Figure 9:
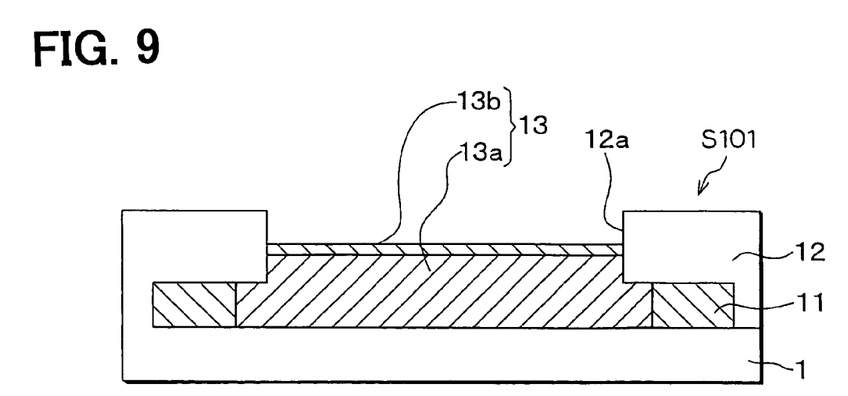
FIG. 9 is a partially enlarged cross sectional view showing an emitter electrode of another semiconductor device as another comparison according to the first embodiment.

The inventors have preliminary studied about an adhesion between an aluminum electrode and a metallic electrode. FIGS. 8 and 9 show a semiconductor device S100, S101 for testing the adhesion between the aluminum electrode and the metallic electrode. As shown in FIG. 8, the semiconductor device S100 includes a semiconductor substrate 1. An aluminum electrode 11 made of aluminum (i.e., Al) is formed on one surface of the semiconductor substrate 1. A protection film 12 made of polyimide or the like is formed on the aluminum electrode 11. An opening 12a is formed in the protection film 12 so that the surface of the aluminum electrode 11 is exposed from the opening 12a. A metal electrode 13 for soldering or wire-bonding is formed on the aluminum electrode 11 through the opening 12a. The metal electrode 13 is formed by a plating method or the like. The metal electrode 13 is made of nickel (i.e., Ni) and gold (i.e., Au) by an electroless plating method. A Ni plating layer 13a and an Au plating layer 13b are deposited on the aluminum electrode 11 in this order so that the metal electrode 13 is formed.

The aluminum electrode 11 is formed on the one surface of the semiconductor substrate 1. The protection film 12 is formed on the aluminum electrode 11. Then, the opening 12a is formed in the protection film 12. Next, the metal electrode 13 is formed on the surface of the aluminum electrode 11 through the opening 12a by the plating method or the like. Before plating, the surface of the aluminum electrode 11 is etched from the opening 12a by acid etchant so that the surface of the aluminum electrode is cleaned. For example, a thin oxide film disposed on the surface of the aluminum electrode 11 is removed. At this time, a concavity 11a is formed on the surface of the aluminum electrode 11 disposed at the opening 12a. The concavity 11a is formed by etching the surface of the aluminum electrode 11 with the acid etchant. Here, the thickness D of a remaining part of the aluminum electrode 11 is thicker than the depth D1 of the concavity 11a. The remaining part of the aluminum electrode 11 is disposed at the opening 12a so that the remaining part is remained after the etching process with an acid etchant.

However, when the bottom of the concavity 11a, i.e., the etched surface of the aluminum electrode 11 is flat (i.e., smooth), adhesion between the aluminum electrode 11 and the metal electrode 13 formed on the aluminum electrode 11 becomes weak so that the metal electrode 13 may be removed from the aluminum electrode 11. Specifically, in a case where a metallic heat sink is soldered on the metal electrode 13, a large stress may be generated at an interface between the heat sink and the metal electrode 13. This is because a linear expansion coefficient of silicon composing the semiconductor substrate 1 is different from that of a metallic material such as copper composing the heat sink. The large stress may cause the removal of the metal electrode 13 from the aluminum electrode 11.

If the etching time for etching the surface of the aluminum electrode 11 is lengthened, the flatness of the etched surface of the aluminum electrode 11 becomes lower, i.e., the bottom of the concavity 11a is lowered, so that the adhesion between the metal electrode 13 and the aluminum electrode 11 is improved. However, the thickness of the aluminum electrode 11 is thin. For example, in general, the thickness of the aluminum electrode 11 is about 1 μm. Therefore, as shown in FIG. 9, when the etching time is lengthened too much, the aluminum electrode 11 may be removed completely so that the semiconductor substrate 1 is exposed. Thus, the metal electrode 13 is deposited directly on the semiconductor substrate 1 without the aluminum electrode 11.

Figure 1:
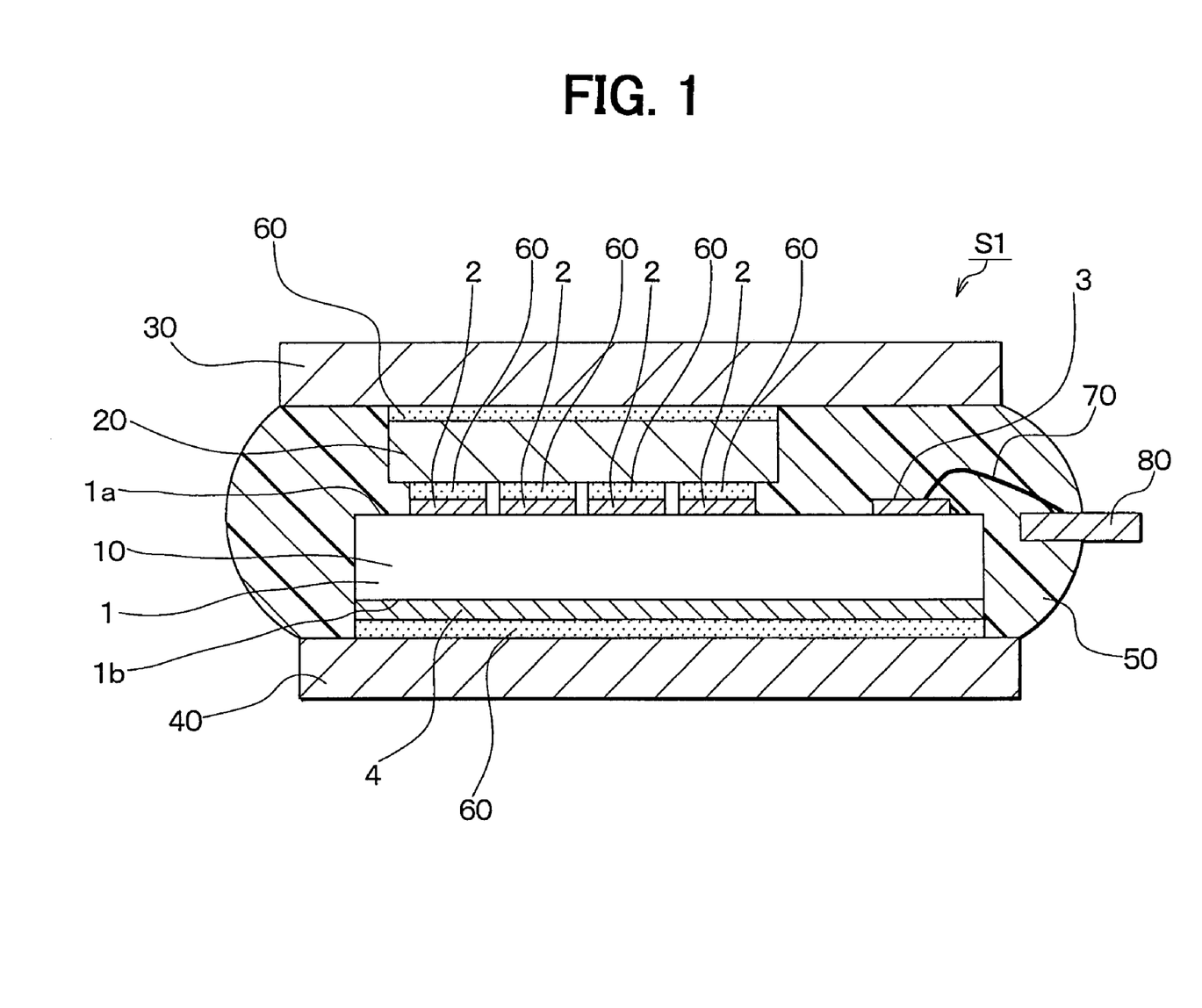
FIG. 1 is a cross sectional view showing a semiconductor device according to a first embodiment of the present invention.
Figure 2A:
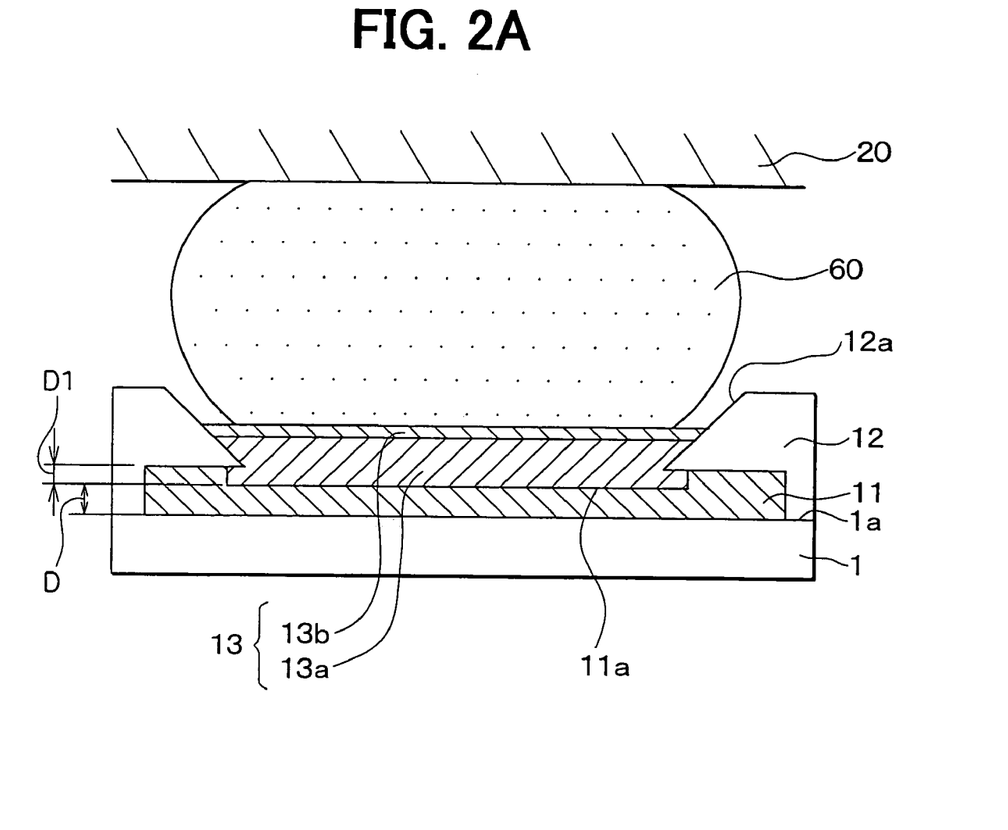
FIG. 2A is a partially enlarged cross sectional view showing an emitter electrode of the device.
Figure 2B:
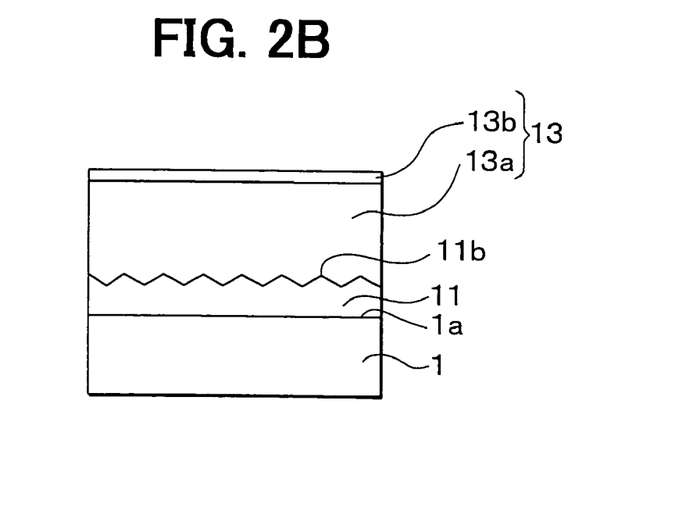
FIG. 2B is a partially enlarged cross sectional view showing an interface between an aluminum electrode and a metal electrode in the device, according to the first embodiment.

In view of the above preliminary study, a semiconductor device S1 according to a first embodiment of the present invention is provided, as shown in FIGS. 1 to 2B. FIG. 2A shows near an emitter electrode 2, and FIG. 2B shows an interface between an aluminum electrode 11 and a metal electrode 13. As shown in FIG. 1, the semiconductor device S1 includes a semiconductor chip 10 having an IGBT (i.e., insulated gate bipolar transistor). The semiconductor chip 10 is sandwiched by three heat sinks 20, 30, 40. Specifically, both surfaces of the semiconductor chip 10 are sandwiched by the heat sinks 20, 30, 40. Further, the semiconductor chip 10 with the heat sinks 20, 30, 40 is molded with a resin mold 50. Thus, the device S1 has a mold construction with the chip 10 soldered both sides.

The semiconductor chip 10 includes a semiconductor substrate 1 such as a silicon substrate. The thickness of the semiconductor substrate 1 is equal to or thinner than 250 μm. The thickness of the substrate 1 is comparatively thin. The chip 10, i.e., the substrate 1 has a top surface 1a and a bottom surface 1b. On the top surface 1a of the semiconductor chip 10, a semiconductor part such as the IGBT is formed. The bottom surface 1b of the chip 10 is opposite to the top surface of the chip 10.

The emitter electrode 2 and a gate electrode 3 are formed on the top surface 1*a* of the semiconductor chip 10. A collector electrode 4 is formed on the bottom surface 1*b* of the semiconductor chip 10. The first heat sink 20 is bonded on the emitter electrode 2 through a solder 60. Further, the second heat sink 30 is bonded to the first heat sink 20 through the solder 60. A bonding wire 70 is connected to the gate electrode 3 so that a lead 80 is electrically connected to the gate electrode 3 through the bonding wire 70. The lead 80 is disposed at a periphery of the chip 10 with the gate electrode 3, and works as a terminal for connecting to an external circuit.

The third heat sink 40 is bonded on the collector electrode 4 through the solder 60. The solder 60 is made of lead free solder (i.e., Pb-free solder) such as Sn—Ag—Cu series solder or Sn—Ni—Cu series solder.

The heat sink 20, 30, 40 are made of excellent heat conductive material such as copper (i.e., Cu). The bonding wire 70 is formed of a wire made of aluminum (i.e., Al), gold (i.e., Au), or the like. The bonding wire 70 is formed by a wire bonding method.

The construction near the emitter electrode 2 is shown in FIG. 2A. The construction near the gate electrode 3 is similar to that of the emitter electrode 2. Here, although the solder 60 is bonded to the emitter electrode 2, the bonding wire 70 is bonded to the gate electrode 3.

As shown in FIG. 2A, the aluminum electrode 11 made of Al film is formed on the top surface 1*a* of the semiconductor substrate 1. The aluminum electrode 11 is formed by a physical vapor deposition method such as a vapor deposition method or a sputtering method. The thickness of the aluminum electrode 11 is, for example, about 1 μm. On the aluminum electrode 11, a protection film 12 is formed. The protection film 12 is made of electrical insulation material such as poly imide resin. The protection film 12 is formed by a spin coating method or the like. The opening 12*a* is formed in the protection film 12 so that the surface of the aluminum electrode 11 is exposed. The opening 12*a* is formed by an etching method with a photo lithography method. Here, a concavity 11*a* is formed on the surface of the aluminum electrode 11 through the opening 12*a*. The concavity 11*a* is formed such that the surface of the aluminum electrode 11 is etched. Here, the thickness D of a remaining part of the aluminum electrode 11 is thicker than the depth D1 of the concavity 11*a*. The remaining part of the aluminum electrode 11 is disposed at the opening 12*a* so that the remaining part is remained after the etching process with an acid etchant. The etching is performed by a wet etching method with the acid etchant such as hydrochloric acid.

The opening 12*a* of the protection film 12 has a tapered shape. Specifically, the opening 12*a* is widened as it goes to the outside. Thus, the opening 12*a* has a predetermined tapered angle, which is smaller than a supplementary angle of a solder contact angle (i.e., a solder wetting angle) of the solder 60.

The metal electrode 13 is formed in the concavity 11*a*. Specifically, the metal electrode 13 is formed on the surface of the aluminum 11 through the opening 12*a* of the protection film 12. The metal electrode 13 is also formed on the gate electrode 3. The metal electrode 13 on the emitter electrode 2 works for soldering, and the metal electrode 13 on the gate electrode 3 works for wire bonding. In this embodiment, the metal electrode 13 is formed by a plating method. For example, the metal electrode 13 is made of a laminated film of Ni/Au, a Cu film or a Ni—Fe alloy film. In the first embodiment, the metallic electrode 13 is made of an electroless plating film of Ni/Au laminated each other.

Specifically, the nickel (i.e., Ni) plating layer 13*a* and the gold (i.e., Au) plating layer 13*b* are formed and laminated on the surface of the aluminum electrode 11 in this order by an electroless plating method. The thickness of the Ni plating layer 13*a* is in a range between 3 μm and 7 μm. For example, the thickness of the Ni plating layer 13*a* is about 5 μm. The thickness of the Au plating layer 13*b* is in a range between 0.04 μm and 0.2 μm. For example, the thickness of the Au plating layer 13*b* is about 0.1 μm. The total thickness of the metal electrode 13 is thinner than that of the protection film 12. Therefore, the upper surface of the metal electrode 13 is disposed in the opening 12*a*. Specifically, the upper surface of the metal electrode 13 is disposed under the upper surface of the protection film 12. Here, since the tapered angle of the opening 12*a* is smaller than the supplementary angle of the solder contact angle of the solder 60, the solder 60 does not contact the protection film 12.

Thus, each of the emitter electrode 2 and the gate electrode 3 is formed of a laminated film composed of the aluminum electrode 11 and the metal electrode 13. The aluminum electrode 11 of each of the emitter electrode 2 and the gate electrode 3 includes an additive material, which has an etching rate smaller than that of aluminum. Thus, multiple convexities 11*b* are formed on the etched surface of the aluminum electrode 11 so that the etched surface of the aluminum electrode 11 has a rough surface (i.e., a surface having multiple concavities and convexities), after the surface of the aluminum electrode 11 is etched with an acid etchant. Specifically, the aluminum electrode 11 includes silicon or the like as the additive material, which has a small etching rate. Thus, the aluminum electrode 11 is made of Al—Si series material or Al—Si—Cu series material. In this embodiment, the aluminum electrode 11 is made of Al—Si series material. In this case, aluminum in the aluminum electrode 11 is etched and solved by the etchant so that a concavity is formed on the etched surface of the aluminum electrode 11, since the aluminum has a comparatively large etching rate. Silicon in the aluminum electrode 11 is etched slowly so that a convexity 11*b* is formed on the etched surface of the aluminum electrode 11, since the silicon has a comparatively small etching rate. Specifically, the convexity 11*b* is mainly made of silicon. Here, it is preferred that a content of silicon in the aluminum electrode 11 is equal to or larger than 0.3 wt. %.

Figure 3A:
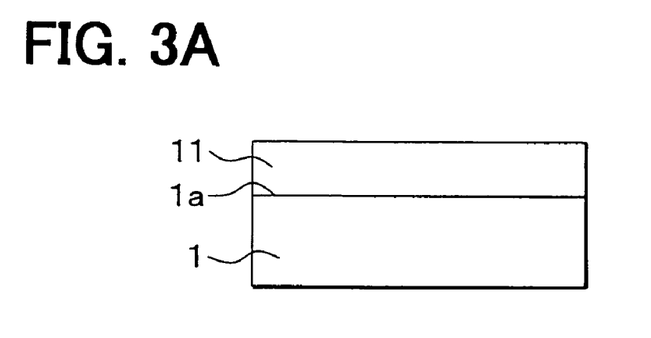
FIGS. 3A to 3C are partially enlarged cross sectional views explaining a method for forming the aluminum electrode and the metal electrode in the device, according to the first embodiment.
Figure 3B:
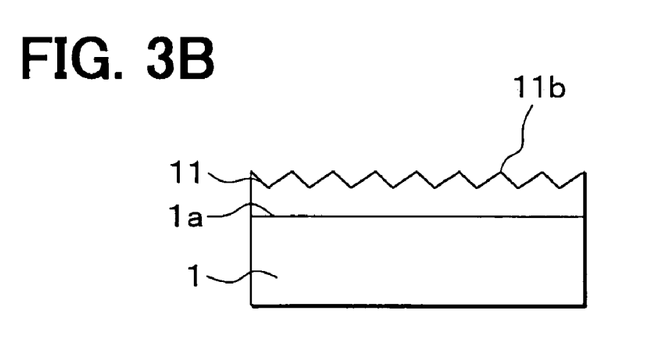
Figure 3C:
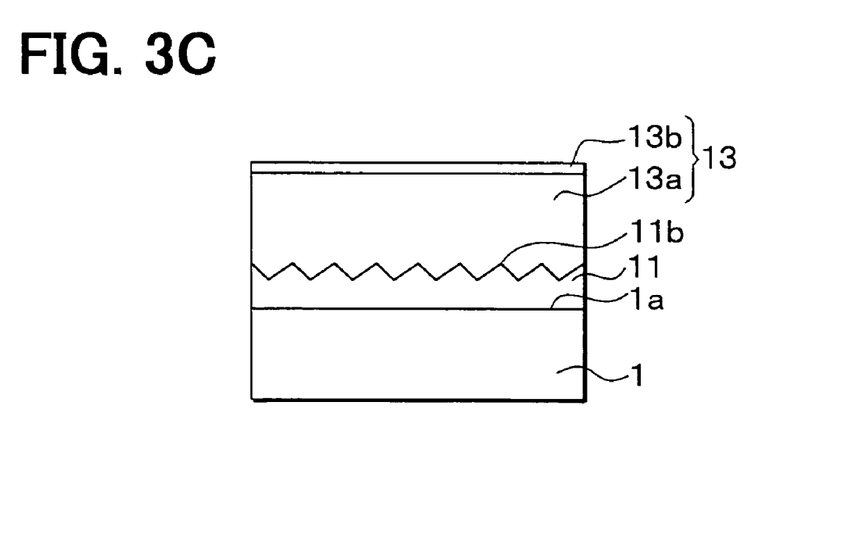

Next, a method for forming the emitter electrode 2 or the gate electrode 3 is described as follows. As shown in FIGS. 3A to 3C, the aluminum electrode 11 is formed on the top surface 1*a* of the semiconductor substrate 1 by a physical vapor deposition (i.e., PVD). Then, the protection film 12 is formed on the aluminum electrode 11 by the spin coating method. The opening 12*a* is formed in the protection film 12 by the etching method or the like.

Then, the surface of the aluminum electrode 11 is etched through the opening 12*a* with the acid etchant such as the hydrochloric acid. Thus, an oxide film disposed on the surface of the aluminum electrode 11 is removed, and the concavity 11*a* is formed. The surface of the aluminum electrode 11 is cleaned. The etching time is controlled such that the thickness D of the remaining part of the aluminum electrode 11 is thicker than the depth D1 of the concavity 11*a*. Thus, the remaining part of the aluminum electrode 11 exposed from the opening 12*a* is appropriately remained.

The aluminum electrode 11 is made of aluminum including silicon. The etching rate of silicon is lower than that of aluminum so that the silicon is etched slowly and remained in the aluminum electrode 11 compared with the aluminum. Therefore, multiple convexities 11*b* is formed on the etched surface of the aluminum electrode 11 so that the surface of the aluminum electrode 11 has concavities and convexities, as shown in FIG. 3B. Here, the convexity 11b is formed because of the existence of silicon.

After that, a metal film is formed on the etched surface of the aluminum electrode 11 so that the metal electrode 13 is provided. The metal film is formed by the electroless plating method so that the electroless Ni/Au laminated film is formed. Thus, the emitter electrode 2 having the aluminum electrode 11 and the metal electrode 13 is provided. Further, the gate electrode 3 having the aluminum electrode 11 and the metal electrode 13 is also provided.

The collector electrode 4 is formed on the bottom surface 1b of the semiconductor substrate 1 by the sputtering method. The collector electrode 4 is disposed almost all area of the bottom surface lb. Specifically, the collector electrode 4 is formed such that a Ti (i.e., titanium) layer, a Ni layer and an Au layer are deposited on the bottom surface 1b of the semiconductor substrate 1 in this order. Thus, a Ti/Ni/Au laminated film is formed so that the collector electrode 4 is provided.

The resin mold 50 is filled between the second heat sink 30 and the third heat sink 40 so that components composing the device S1 disposed between the second heat sink 30 and the third heat sink 40 are sealed with the resin mold 50. A connecting portion of the lead 80 connecting to the bonding wire 70 is sealed with the resin mold 50. The resin mold 50 is made of conventional molding material such as epoxy resin.

The semiconductor device S1 has the above construction. In the device S1, the heat generated in the semiconductor chip 10 conducts to the heat sinks 20, 30, 40 through the solder 60 having excellent heat conductivity so that the heat is radiated to the outside. Therefore, the heat is radiated from both sides 1a, 1b of the semiconductor chip 10. Further, each heat sink 20, 30, 40 provides an electric path for connecting to the semiconductor chip 10. Specifically, the emitter electrode 2 of the semiconductor chip 10 is electrically connected to the external circuit through the first and second heat sinks 20, 30. The collector electrode 4 of the semiconductor chip 10 is connected to the external circuit through the third heat sink 40.

Next, the semiconductor device S1 is assembled as follows. At first, the solder 60 is put on each electrode 2–4 of the semiconductor chip 10. The first and third heat sinks 20, 40 are bonded to the semiconductor chip 10 through the solder 60. Then, the gate electrode 3 of the semiconductor chip 10 and the lead 70 are electrically connected with the bonding wire 70 by the wire bonding method. The second heat sink 30 is bonded to the outside of the first heat sink 20 through the solder 60. Then, the components of the device S1 are sealed with the resin mold 50. Thus, the semiconductor device S1 is completed.

The semiconductor device S1 includes the semiconductor substrate 1, the aluminum electrode 11 formed on the one surface (i.e., the top surface) 1a of the semiconductor substrate 1, the protection film 12 formed on the aluminum electrode 11, the opening 12a formed on the protection film 12, and the metal electrode 13 formed on the aluminum electrode 11 through the opening 12a for soldering or wire bonding. The surface of the aluminum electrode 11 disposed in the opening 12a has the concavity 11a formed by etching. The thickness D of the remaining part of the aluminum electrode 11 is larger than the depth D1 of the concavity 11a. Therefore, the remaining part of the aluminum electrode 11 has an appropriate thickness.

The aluminum electrode 11 includes the additive material, which has the etching rate smaller than that of aluminum. Thus, the etched surface of the aluminum electrode 11 has concavities and convexities provided by the convexities 11b after the surface of the aluminum electrode 11 is etched with the acid etchant. The convexities 11b is formed by the additive material. The metal electrode 13 is formed on the etched surface of the aluminum electrode 11 having the concavities and convexities so that the bonding area between the aluminum electrode 11 and the metal electrode 13 becomes large. Thus, anchor effect for bonding the metal electrode 13 to the aluminum electrode 11 becomes larger. Therefore, the adhesion between the aluminum electrode 11 and the metal electrode 13 is improved by the anchor effect.

Figure 4:
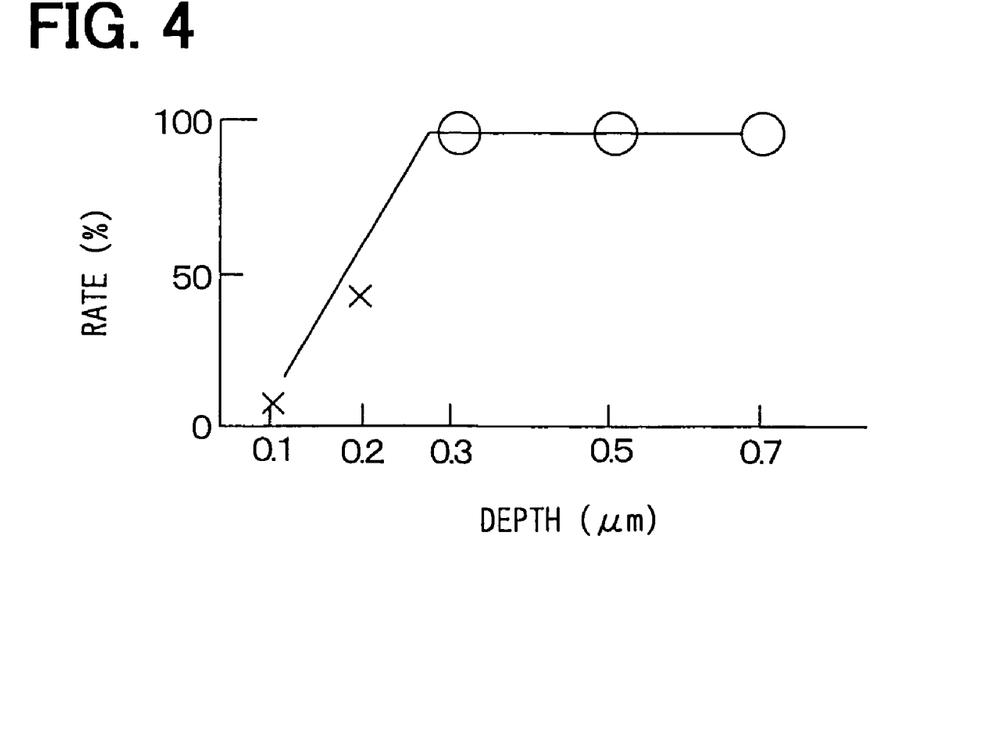
FIG. 4 is a graph showing a relationship between a depth of a concavity and a rate of fair quality, according to the first embodiment.

The improvement of the adhesion is described as follows. FIG. 4 shows a relationship between the depth D1 of the concavity 11a and a rate of fair quality (i.e., inversion of defective fraction). The depth D1 of the concavity la corresponds to the amount of etching of the aluminum electrode 11, i.e., the amount of the etched Al—Si series material in the aluminum electrode 11. The rate of fair quality (i.e., the RATE in FIG. 4, the unit of which is percentage) is defined as the rate of the device having fair quality, in which the metal electrode 13 is not removed from the aluminum electrode 11.

As shown in FIG. 4, when the surface of the aluminum electrode 11 is etched appropriately, the removal of the metal electrode 11 from the aluminum electrode 11 is reduced. When the depth D1 of the concavity 11a is equal to or larger than 0.3 µm, the rate of fair quality reaches almost the maximum.

Figure 5:
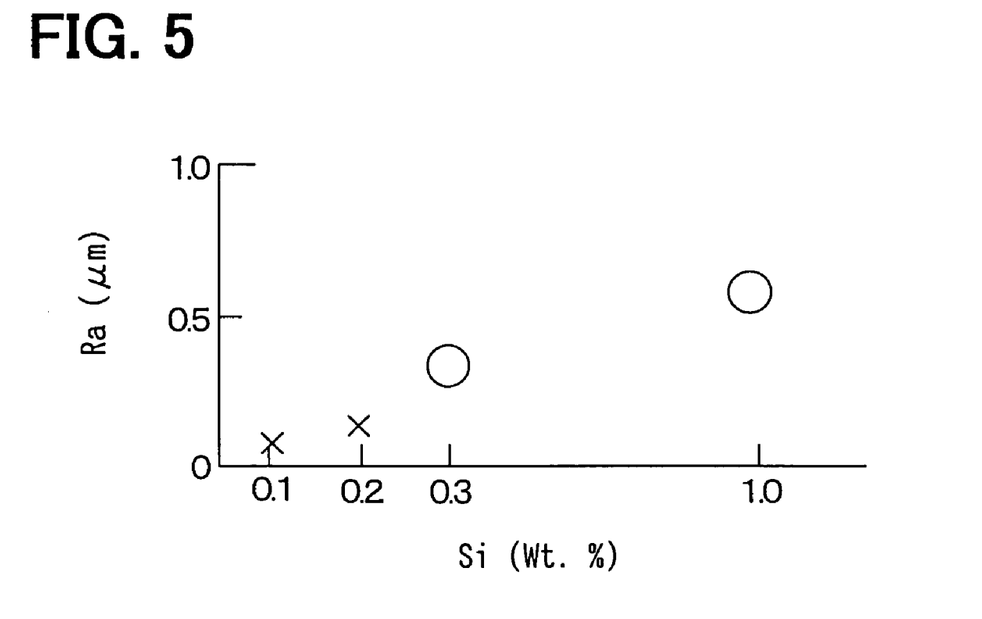
FIG. 5 is a graph showing a relationship between a content of silicon and a surface roughness of the aluminum electrode, according to the first embodiment.

When the aluminum electrode 11 includes the additive of silicon in the aluminum, the convexity 11b is mainly made of silicon. Preferably, the content of silicon is equal to or larger than 0.3 wt. % of the aluminum electrode 11. The reason is described as follows. FIG. 5 shows a relationship between the content of silicon in the aluminum electrode 11 and a surface roughness (i.e., Ra) of the etched surface of the aluminum electrode 11. Specifically, the surface roughness Ra is defined at the bottom of the opening 11a after the surface of the aluminum electrode 11 is etched.

The surface roughness Ra represents a degree of convexity and concavity on the etched surface of the aluminum electrode 11. When the surface roughness Ra is equal to or larger than 0.3 µm, the depth D1 of the concavity 11a becomes equal to or larger than 0.3 µm. In this case, the rate of fair quality reaches almost 100%. In FIG. 5, when the content of silicon is equal to or larger than 0.3 wt. %, the surface roughness Ra becomes equal to or larger than 0.3 µm. Thus, it is preferred that the content of silicon in the aluminum electrode 11 is equal to or larger than 0.3 wt. %.

The metal electrode 13 is bonded with the solder 60 made of Pb free solder. The Pb free solder is harder than a conventional Pb solder. Therefore, the stress applied to the metal electrode 11 bonded with the Pb free solder becomes larger than that bonded with the conventional Pb solder so that the metal electrode 13 may be easily removed from the aluminum electrode 11. Although the semiconductor device S1 has the metal electrode 13 bonded with the Pb free solder, the adhesion between the metal electrode 13 and the aluminum electrode 11 is comparatively strong since the etched surface of the aluminum electrode 11 has the concavity and convexity.

Further, the metal electrode 13 is bonded to the heat sink 20 made of metal through the Pb free solder. When the heat sink 20 is soldered on the semiconductor substrate 1 through the metal electrode 13, the stress is generated between the heat sink 20 and the semiconductor substrate 1. This stress is caused by the difference of the linear expansion coefficient between the semiconductor substrate 1 (i.e., silicon composing the substrate 1) and the heat sink 20 (i.e., metal such as copper composing the heat sink 20). The stress is comparatively large so that the metal electrode 13 may be removed from the aluminum electrode 11. Although the semiconductor device S1 has the heat sink 20 bonded to the semiconductor substrate 1, the adhesion between the metal electrode 13 and the aluminum electrode 11 is comparatively strong. Therefore, the metal electrode 13 is protected from removing from the aluminum electrode 11.

Preferably, the thickness of the semiconductor substrate 1 is equal to or smaller than 250 μm. When the semiconductor substrate 1 is appropriately thin, the stress is relaxed (i.e., reduced). Thus, the metal electrode 13 is limited from removing from the aluminum electrode 11 so that the device S1 has high reliability of the adhesion between the metal electrode 13 and the aluminum electrode 11.

Although the device S1 has the mold structure with the semiconductor substrate 1 soldered both sides thereof, the above construction can be applied to a device including a semiconductor substrate, an aluminum electrode formed on one surface of the substrate, a protection film formed on the aluminum electrode, an opening formed in the protection film, and a metal electrode for soldering or for wire bonding formed on the aluminum electrode through the opening.

(Second Embodiment)

Figure 6A:
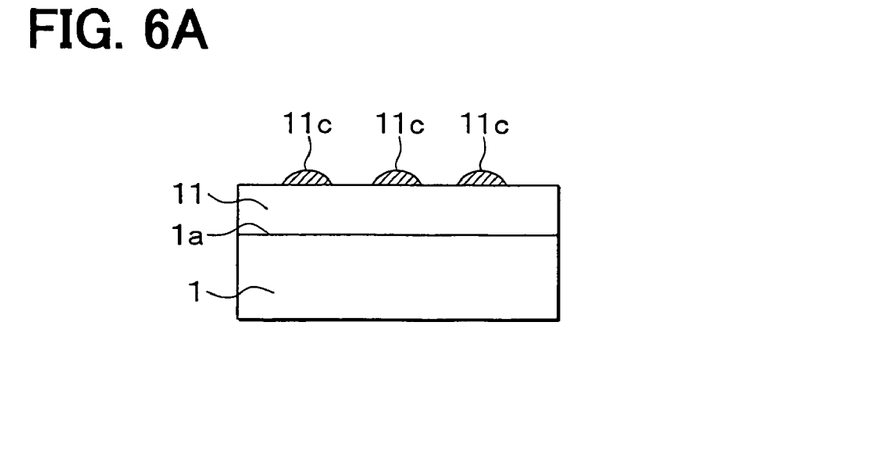
FIGS. 6A to 6C are partially enlarged cross sectional views explaining a method for forming the aluminum electrode and the metal electrode in a semiconductor device according to a second embodiment of the present invention.
Figure 6B:
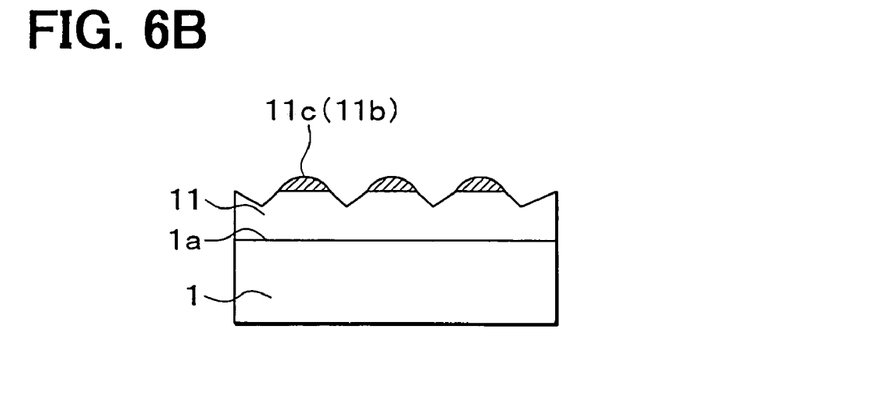
Figure 6C:
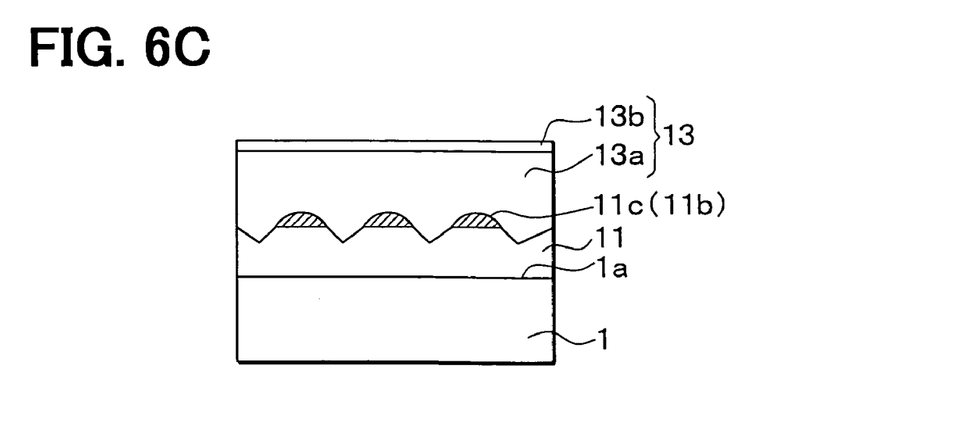

A method for forming the concavity and convexity on a surface of each of the emitter electrode 2 and the gate electrode 3 is provided. FIGS. 6A to 6C show the method according to a second embodiment of the present invention. In FIG. 6A to 6C, the protection film 12 is omitted to describe.

As shown in FIG. 6A, a small etch rate part 11c made of a material having a small etch rate smaller than that of aluminum is formed on the surface of the aluminum electrode 11. Specifically, the small etch rate part 11c is formed on the aluminum electrode through the opening 12a in the protection film 12. Multiple small etch rate parts 11c have an island structure. The small etch rate part 11c having the island structure is formed by a sputtering method with shortening a sputtering time (i.e., a deposition time). The small etch rate part 11c is made of titanium (i.e. Ti), nickel (i.e., Ni) or gold (i.e., Au). Then, the surface of the aluminum electrode 11 is etched through the opening 12a by the wet etching method with the acid etchant such as hydrochloric acid. Here, the small etch rate material 11c is etched slowly compared with the aluminum so that the small etch rate part 11c is easily remained. Therefore, the etched surface of the aluminum electrode 11, i.e., the bottom of the concavity 11a has the concavity and convexity composing the convexities 11c. Then, the metal electrode 13 is formed on the etched surface of the aluminum electrode 11 having the concavity and convexity by the plating method, as shown in FIG. 6C. Thus, the emitter electrode 2 and the gate electrode 3 having the aluminum electrode 11 and the metal electrode 13 are completed.

(Third Embodiment)

Figure 7:
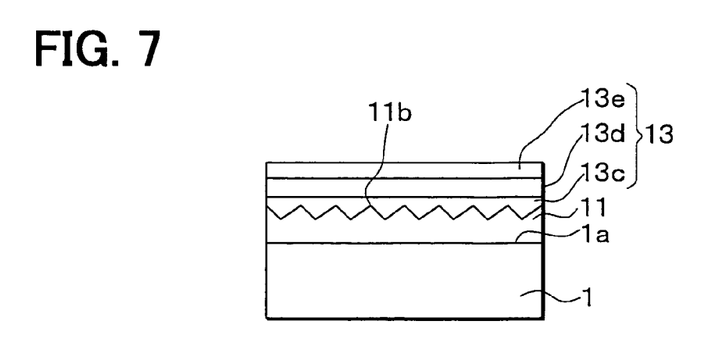
FIG. 7 is a partially enlarged cross sectional view showing an interface between an aluminum electrode and a metal electrode in a semiconductor device according to a third embodiment of the present invention.

The metal electrode 13 in the device S1 according to a third embodiment of the present invention is formed by the physical vapor deposition (i.e., PVD) method such as a vapor deposition method or the sputtering method. After the concavity and convexity is formed on the surface of the aluminum electrode 11, the metal electrode 13 is formed on the surface of the aluminum electrode 11. In FIG. 7, the metal electrode 13 is made of a Ti layer 13c, a Ni layer 13d and an Au layer 13e. The Ti layer has the thickness of about 0.3 μm. The Ni layer 13d has the thickness of 0.5 μm. The Au layer 13e has the thickness of 0.1 μm. The Ti layer 13c, the Ni layer 13d and the Au layer 13e are laminated in this order on the aluminum electrode 11.

Such changes and modifications are to be understood as being within the scope of the present invention as defined by the appended claims.

What is claimed is:

1. A semiconductor device comprising:

a semiconductor substrate;

an aluminum electrode disposed on the substrate;

a protection film disposed on the aluminum electrode;

an opening disposed on the protection film for exposing the aluminum electrode; and a metal electrode disposed on a surface of the aluminum electrode through the opening, wherein the aluminum electrode includes a concavity disposed under the opening and approximately coextensive with a lower portion of the opening, wherein the aluminum electrode disposed at the concavity has a thickness equal to or larger than a depth of the concavity, wherein the surface of the aluminum electrode includes multiple concavities and multiple convexities, and wherein the aluminum electrode includes an additive having an etch rate in an acid etchant equal to or smaller than that of aluminum in the aluminum electrode so that the convexities are provided on the surface of the aluminum electrode.

2. The device according to claim 1, wherein the metal electrode includes at least one of nickel, gold, copper, iron and titanium.

3. The device according to claim 2, wherein the metal electrode is a laminated Ni/Au film, a Cu film, a Ni—Fe alloy film or a Ti/Ni/Au laminated film.

4. The device according to claim 1, wherein the semiconductor substrate is made of silicon, and wherein the protection film is made of resin.

5. The device according to claim 1, wherein the opening the the protection film has a lower portion smaller than the concavity so that the protection film overhangs the concavity of the aluminum electrode.

6. The device according to claim 5, wherein the metal electrode is disposed in the concavity of the aluminum electrode and the opening.

7. The device according to claim 6, wherein the metal electrode is thinner than the protection film so that an upper surface of the metal electrode is disposed in a middle of the opening.

8. The device according to claim 1, wherein the additive in the aluminum electrode is silicon.

9. The device according to claim 8, wherein the additive in the aluminum electrode has a content equal to or larger than 0.3 weight percent.

10. The device according to claim 1,
wherein the additive is disposed on the surface of the aluminum electrode so that the convexities are provided.

11. The device according to claim 1,
wherein the metal electrode is made of a plating film.

12. The device according to claim 11,
wherein the metal electrode includes a nickel electroless plating film and a gold electroless plating film disposed on the aluminum electrode in this order.

13. The device according to claim 1,
wherein the metal electrode is made of a physical vapor deposition film.

14. The device according to claim 1,
wherein the metal electrode connects to an external circuit through a lead free solder.

15. The device according to claim 14,
wherein the opening of the protection film has a tapered shape with a tapered angle, which is smaller than a supplementary angle of a solder contact angle of the lead free solder,
wherein the metal electrode is disposed in the concavity of the aluminum electrode and the opening, and
wherein the metal electrode is thinner than the protection film so that an upper surface of the metal electrode is disposed in a middle of the opening.

16. The device according to claim 1,
wherein the metal electrode connects to a metallic heat sink through a lead free solder.

* * * * *